United States Patent
Hsia et al.

(10) Patent No.: US 8,046,860 B2
(45) Date of Patent: Nov. 1, 2011

(54) SYSTEM AND METHOD FOR REMOVING PARTICLES IN SEMICONDUCTOR MANUFACTURING

(75) Inventors: Chen-Yuan Hsia, Hsin-Chu (TW);
Chang-Cheng Hung, Jhubei (TW);
Chi-Lun Lu, Changhua (TW);
Shih-Ming Chang, Hsin-Chu (TW);
Wen-Chuan Wang, Taipei (TW);
Yen-Bin Huang, Tainan (TW);
Ching-Yu Chang, Yilang (TW);
Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/885,630

(22) Filed: Sep. 20, 2010

(65) Prior Publication Data
US 2011/0005010 A1   Jan. 13, 2011

Related U.S. Application Data

(62) Division of application No. 11/204,691, filed on Aug. 16, 2005, now Pat. No. 7,819,980.

(51) Int. Cl.
*A47L 13/40* (2006.01)
(52) U.S. Cl. .................. 15/1.51; 15/4; 361/230
(58) Field of Classification Search ............... 15/1.51, 15/4; 361/143, 225, 230, 234
See application file for complete search history.

(56) References Cited

U.S. PATENT DOCUMENTS

| | | | | |
|---|---|---|---|---|
| 5,231,622 | A * | 7/1993 | Hayashi | 369/73 |
| 5,350,428 | A * | 9/1994 | Leroux et al. | 29/25.01 |
| 6,495,215 | B1 * | 12/2002 | Kamikawa | 427/541 |
| 2002/0134399 | A1 * | 9/2002 | Taylor | 134/1 |

* cited by examiner

*Primary Examiner* — Randall Chin
(74) *Attorney, Agent, or Firm* — Haynes and Boone, LLP

(57) ABSTRACT

A system for semiconductor wafer manufacturing, comprises a chamber process path for processing the wafer, and a device operable to remove particles from the wafer by electrostatic and electromagnetic methodologies wherein the device is installed in the chamber process path.

20 Claims, 2 Drawing Sheets

SYSTEM AND METHOD FOR REMOVING PARTICLES IN SEMICONDUCTOR MANUFACTURING

PRIORITY DATA

This application claims priority to application Ser. No. 11/204,691, filed on Aug. 16, 2005, entitled "A SYSTEM AND METHOD FOR REMOVING PARTICLES IN SEMICONDUCTOR MANUFACTURING," the entire disclosure of which is incorporated herein by reference.

BACKGROUND

During the manufacturing of semiconductor devices, unwanted particles are often deposited on wafers from known or unknown sources. Such deposition may occur on various layers of a wafer, such as the substrate, photoresist layer, photo mask layer, and/or other layers of the wafer. As the dimensions of wafers continue to decrease, the presence of even a few particles may adversely affect the quality of the semiconductor device and result in the reduction of yield. For example, due to the presence of one or more particles on the surface of a wafer, an etching process may result in an undesired uneven surface.

Accordingly, manufacturers strive to remove undesirable particles from wafers. However, previously available art is focused on passively detecting defects caused by the presence of particles. Frequently, manufacturers simply impose such responsibilities upon the operators, who are already burdened with the ordinary operational tasks. Since the probability of particle deposition on the wafers is random, it is challenging to identify the root cause of the deposition and means for eliminating them. As a result, semiconductor devices have to been discarded due to defects caused by the presence of particles that should have been removed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting.

The improved method for proactively removing particles from semiconductor wafers introduces an apparatus with electrostatic and/or electromagnetic capability to attract and remove the particles form the wafer during the process of scanning the wafer. The apparatus may be installed at various locations and performed multiple times during the manufacturing process. In one example, the apparatus may be a stand-alone unit or an integrated unit that is installed at the entrance of a process chamber. As a result, whenever the wafer is transferred into or from the chamber, the apparatus may be used to scan the wafer and remove unwanted particles from the wafer.

Figure 1:
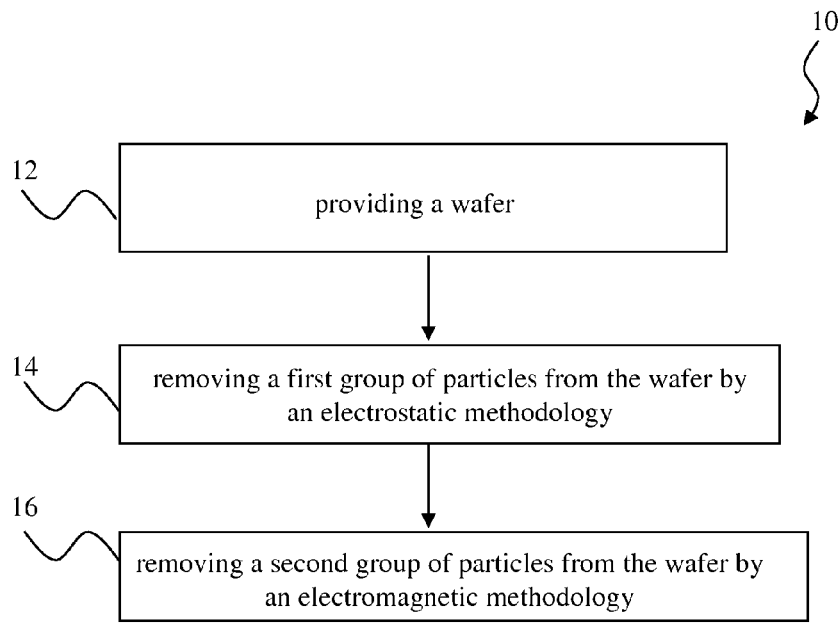
FIG. 1 is a simplified flowchart of an embodiment of a method to remove unwanted particles.

Referring to FIG. 1, an exemplary method 10 for removing particles in semiconductor manufacturing is shown. In this embodiment, method 10 initiates with step 12, which provides a wafer or otherwise conveys a wafer to the apparatus. The wafer may include a substrate, a dielectric layer, a bottom anti-reflective coating (BARC) layer, and a photoresist layer, for example. The substrate may include one or more insulator, conductor, and/or semiconductor layers. For example, the substrate may include an elementary semiconductor, such as crystal silicon, polycrystalline silicon, amorphous silicon, and/or germanium; a compound semiconductor, such as silicon carbide and/or gallium arsenic; an alloy semiconductor, such as SiGe, GaAsP, AlInAs, AlGaAs, and/or GaInP. Further, the substrate may include a bulk semiconductor, such as bulk silicon, and such a bulk semiconductor may include an epi silicon layer. It may also or alternatively include a semiconductor-on-insulator substrate, such as a silicon-on-insulator (SOI) substrate, or a thin-film transistor (TFT) substrate. The substrate may also or alternatively include a multiple silicon structure or a multilayer compound semiconductor structure. The dielectric layer may be formed by chemical vapor deposition (CVD), plasma-enhanced CVD (PECVD), physical vapor deposition (PVD), atomic layer deposition (ALD), spin-on coating and/or other processes. The dielectric layer may be an inter-metal dielectric (IMD), and may include low-k materials, silicon dioxide, polyimide, spin-on-glass (SOG), fluoride-doped silicate glass (FSG), Black Diamond® (a product of Applied Materials of Santa Clara, Calif.), Xerogel, Aerogel, amorphous fluorinated carbon, and/or other materials. The BARC layer may be deposited over the dielectric layer by a variety of techniques, including but not limited to spin-on coating, PVD, CVD, and/or other processes. The photoresist layer may be formed by spin-on coating and/or other processes. In operation, a photoresist solution is dispensed onto the surface of the BARC layer, and the wafer is spun rapidly until the photoresist solution is almost dry, and then baked to harden the material.

The wafer may be transferred to an etching chamber (not shown) for etching purposes. The etching chamber may include particles, which may be deposited over the wafer. For example, a ferromagnetic material such as iron, nickel, cobalt, gadolinium, dysprosium, rare earth material; an insulator, such as polyester plastics, hair, wool fabrics, Teflon; and/or other materials, may be deposited over the wafer. In one example, the particles may included organic materials, such as organic O and/or organic C; inorganic materials, such as inorganic Si, inorganic S, inorganic CI, and/or inorganic B; metal, such as Fe, Al, Cu, Zn, Na; and/or other materials.

During the fabrication process and between the formation or processing of any material layers on the substrate, the particle removal process may be carried out. In step 14, a first group of particles is removed from the wafer by a first device using electrostatic methodology. In step 14, the wafer is put in the presence of a static electric field, which attracts particles on the surface of the wafer that are net positively charged. Further, the unwanted particles may include an insulator, such as polyester plastics, hair, wool fabrics, Teflon, and/or other materials. This type of particles may be attracted and removed using the electrostatic methodology.

In step 16, a second group of particles is removed from the wafer by an electromagnetic methodology. In this step, the wafer is put in the presence of an electromagnetic field, which attracts and removes particles that are magnetic or become magnetic during the fabrication process. These particle(s) may include a ferromagnetic metal (such as iron, nickel, cobalt, gadolinium, or dysprosium), which may exhibit magnetic behavior. A second device (i.e. second to the first device described in association with the electrostatic methodology) may be used to generate the electromagnetic field described in this step. As a result, the second device may attract and remove the particles from the wafer. The second device may be any electromagnetic device known in the art. It should be noted that steps 14 and 16 may be inter-changed in sequence, and either step may be optionally omitted at one or more occasions during the manufacturing process.

The method 10 may be utilized in the manufacturing of a variety of semiconductor devices (with or without the damascene technology), such as memory devices (including but not limited to a static random access memory (SRAM)), logic devices (including but not limited to a metal-oxide semiconductor field-effect transistor (MOSFET)), and/or other devices. The method 10 may be applied to either dry lithography or wet lithography.

Figure 2:
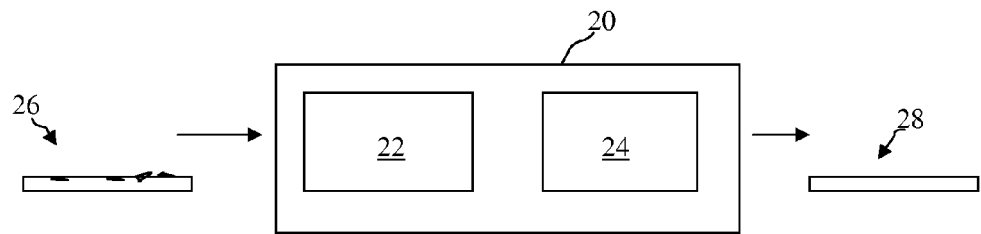
FIG. 2 is a simplified block diagram of an embodiment of an integrated device to remove unwanted particles.

It is contemplated that the first and second devices may be integrated into a single device or may be stand-alone devices positioned at various points in the semiconductor processing path. FIG. 2 is a simplified block diagram of an embodiment of an integrated device 20 that incorporates an electrostatic device 22 and an electromagnetic device 24 to remove unwanted particles of various types. Electrostatic device 22 is operable to remove electrostatically-charged particles from the wafers 26 to yield clean wafers 28. Electromagnetic device 24 is operable to remove magnetic particles from the wafers 26. Alternatively, the first and/or second devices 22 and 24 may be integrated into existing equipment in the semiconductor manufacturing facility. In one example, the devices (integrated or not) may be installed at the entrance of a processing chamber, so that it may be used to scan the wafer and remove particles therefrom prior to or after processing. In a second example, the device may be used prior to or following one or more manufacturing steps, such as exposure, development, etching, and/or other steps.

Figure 3:
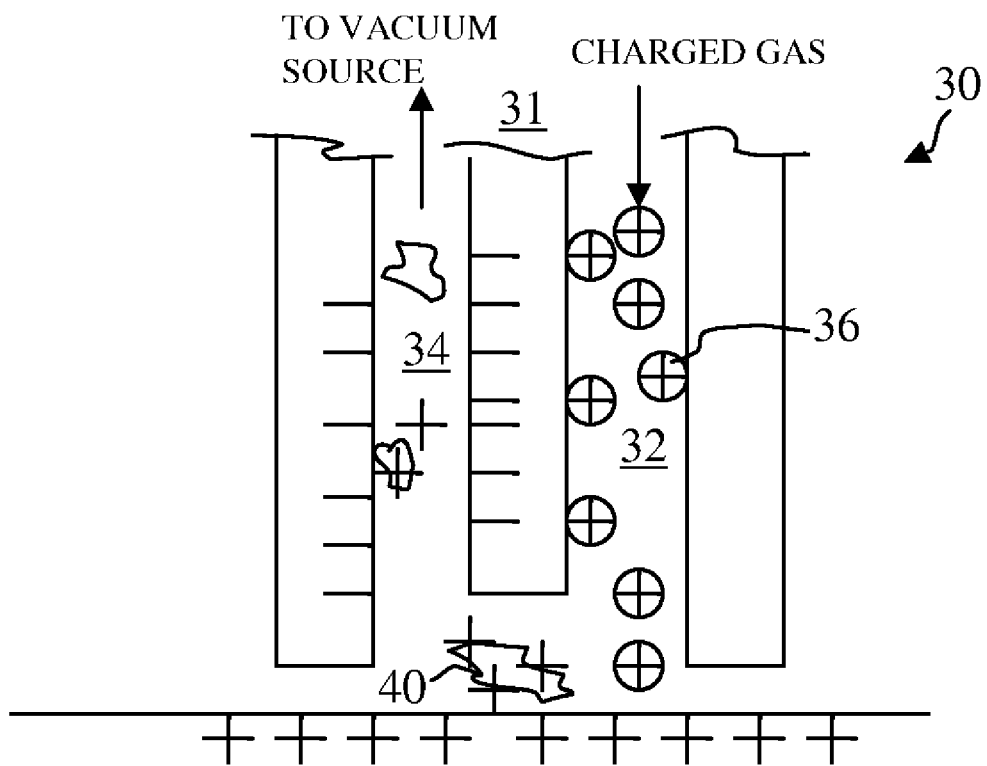
FIG. 3 is a simplified schematic diagram of an embodiment of a device that uses electrostatic electricity to remove unwanted particles.

FIG. 3 is a simplified schematic diagram of an exemplary embodiment of a first device 30 that uses electrostatic electricity to remove unwanted particles. Device 30 comprises a processing chamber with a nozzle 31 equipped with an inlet 32 and an outlet 34. Inlet 32 is coupled to a purge gas source (not shown). The purge gas may comprise electrostatically-charged gas molecules or ions 36, for example positively-charged gas molecules or ions as shown. Examples of purge gases include compressed dry air (CDA), nitrogen ($N_2$), carbon dioxide ($CO_2$), and argon (Ar). Outlet 34 is coupled to a low pressure sink, such as a vacuum pump device (not shown). The wafer 38 is coupled to a source of positive charges so that the wafer as well as unwanted particles 40 resting thereon become positively charged. Further, the inner walls of outlet 34 may be coupled to a source of the opposite charge, i.e. negative charges. As nozzle 31 passes over the surface of the wafer (or as the wafer passes under the nozzle), gas molecules or ions 36 that are similarly charged as the wafer is injected via inlet 32. Because the charged particles are oppositely-charged from the outlet and because of the flow of purge gas from the inlet to the outlet, the particles become attracted toward the outlet and are eventually evacuated.

It should be noted that many variations of the above embodiments are contemplated herein. In one example, the particles may be composed of a single material or it may be a combination of two or more materials. The first and second devices may be constructed as separate units or as an integrated unit, and that they may be installed at identical or different locations of the manufacturing facility.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. An apparatus, comprising:
    an electrostatic component that generates an electric field and removes electrostatically-charged particles from a wafer through the electric field, wherein the electrostatic component includes an inlet and an outlet, and wherein a surface of the wafer is exposed to both the inlet and the outlet, the electrostatic component being operable to charge the outlet and the wafer to opposite electrical polarities; and
    a magnetic component that generates a magnetic field and removes magnetized particles from the wafer through the magnetic field, wherein the magnetic component removes the magnetized particles without contacting the wafer.

2. The apparatus of claim 1, wherein the magnetic component is operable to generate the magnetic field in proximity to a surface of the wafer.

3. The apparatus of claim 1, wherein the magnetized particles include ferromagnetic particles.

4. The apparatus of claim 1, wherein the magnetized particles are selected from the group consisting of iron, nickel, and cobalt.

5. The apparatus of claim 1, wherein the electrostatic component causes a plurality of electrostatically-charged particles to flow from the inlet to the outlet, the electrostatically-charged particles being charged to the same electrical polarity as the wafer.

6. The apparatus of claim 1, wherein the electrostatic component is operable to simultaneously charge the outlet and the wafer.

7. The apparatus of claim 1, wherein the electrostatic component includes a nozzle having the inlet and the outlet therein.

8. An apparatus, comprising:
    an electrostatic device that removes a first group of particles from a wafer, the electrostatic device including:
        a nozzle having an inlet and an outlet;
        a purge gas source coupled to the inlet;
        a vacuum pump coupled to the outlet;
        a first electric charge source that provides electric charges of a first type to the wafer; and
        a second electric charge source that provides electric charges of a second type to the outlet, the second type being opposite the first type; and
    a magnetic device that removes a second group of particles from the wafer without contacting the wafer.

9. The apparatus of claim 8, wherein the magnetic device generates a magnetic field and removes the second group of particles from the wafer by attracting the second group of particles to the magnetic device through the magnetic field.

10. The apparatus of claim 8, wherein:
the first group of particles includes electrostatically-charged particles; and
the second group of particles includes magnetized particles.

11. The apparatus of claim 8, wherein:
the first group of particles include particles selected from the group consisting of polyester plastics, hair, and wool fabrics; and
the second group of particles includes particles selected from the group consisting of iron, nickel, cobalt, gadolinium, and dysprosium.

12. The apparatus of claim 8, wherein the purge gas source propels a purge fluid to flow from the inlet to the outlet, the purge fluid flowing over a surface of the wafer.

13. The apparatus of claim 12, wherein the purge gas source electrically charges the purge fluid to the first type.

14. The apparatus of claim 12, wherein the purge fluid is selected from the group consisting of: compressed dry air, nitrogen, carbon dioxide, and argon.

15. The apparatus of claim 8, wherein the electrostatic device is operable to scan a surface of the wafer using the nozzle.

16. The apparatus of claim 8, wherein the electrostatic device and the magnetic device are integrated into a single device.

17. A system, comprising:
a magnetic device that removes a plurality of magnetized particles from a wafer through application of a magnetic force, wherein the magnetic device is physically separated from the wafer;
a nozzle having an inlet from which an electrostatically-charged fluid enters and an electrostatically-charged outlet from which the fluid exits, wherein the fluid and the outlet are oppositely charged; and
a charge source that electrostatically charges the fluid and the outlet, the charge source charging the wafer to the same polarity as the fluid;
wherein a plurality of electrostatically-charged particles from the wafer are removed in response to:
the flow of the fluid; and
the respective electrostatic charges of the fluid, the outlet, and the wafer.

18. The system of claim 17, wherein the inlet and the outlet of the nozzle are operable to scan different areas of the wafer.

19. The system of claim 17, further including a pressure source that supplies the fluid to the inlet and propagates the fluid to flow from the inlet to the outlet.

20. The system of claim 17, wherein:
the electrostatically-charged particles are selected from the group consisting of polyester plastics, hair, and wool fabrics; and
the magnetized particles are selected from the group consisting of iron, nickel, cobalt, gadolinium, and dysprosium.

* * * * *